United States Patent
Yang et al.

(10) Patent No.: US 8,432,980 B2
(45) Date of Patent: Apr. 30, 2013

(54) METHOD AND SYSTEM OF INTERLEAVING FOR A MULTIPLE-INPUT MULTIPLE-OUTPUT MULTI-BAND OFDM COMMUNICATION SYSTEM

(75) Inventors: Jun Yang, Croton-On-Hudson, NY (US); Dong Wang, Ossining, NY (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 719 days.

(21) Appl. No.: 12/529,413

(22) PCT Filed: Mar. 12, 2008

(86) PCT No.: PCT/IB2008/050903
§ 371 (c)(1),
(2), (4) Date: Sep. 1, 2009

(87) PCT Pub. No.: WO2008/110998
PCT Pub. Date: Sep. 18, 2008

(65) Prior Publication Data
US 2010/0098178 A1    Apr. 22, 2010

Related U.S. Application Data (60) Provisional application No. 60/894,521, filed on Mar. 13, 2007.

(51) Int. Cl.
*H04K 1/10*    (2006.01)
(52) U.S. Cl.
USPC ........... 375/260; 375/261; 375/267; 375/295; 375/299; 375/350
(58) Field of Classification Search .................. 375/130, 375/219, 259, 260, 261, 267, 271, 286, 295, 375/298, 300, 322
See application file for complete search history.

(56) References Cited

U.S. PATENT DOCUMENTS

| | | | | |
|---|---|---|---|---|
| 7,068,703 | B2 * | 6/2006 | Maric | 375/136 |
| 7,272,162 | B2 * | 9/2007 | Sano et al. | 375/135 |
| 7,979,775 | B2 * | 7/2011 | Yu et al. | 714/755 |

(Continued)

FOREIGN PATENT DOCUMENTS

| | | |
|---|---|---|
| WO | WO2005055544 A1 | 6/2005 |
| WO | WO2006007571 A1 | 1/2006 |
| WO | WO 2006064469 A1 * | 6/2006 |

OTHER PUBLICATIONS

"Information Technology—Telecommunications and Information Exchange between Systems—high rate Ultra Wideband PHY and MAC Standard", International Standard ISO/IEC 26907, Chapter 10.8 Bit Interleaving, Mar. 1, 2007, pp. 46-47, XP002496048.

*Primary Examiner* — Hirdepal Singh
(74) *Attorney, Agent, or Firm* — Larry Liberchuk (57) ABSTRACT

A multiple-input multiple-output multi-band OFDM transmission system (400) employs a data interleaving arrangement that is backwards compatible with specifications for a legacy interleaver. In one embodiment, an input data stream is parsed into two or more separate data streams by a round robin parser (310) and each of the separate data streams is shifted by a corresponding number of symbols and then interleaved by a legacy interleaver (340i). In another embodiment, data for a plurality (N*i) of symbols is split into N sequential groups of data, each group corresponding to one of N MIMO spatial streams, each stream including data for i symbols. Each group is then interleaved by a legacy interleaver (520i). In a third embodiment, an input data stream is interleaved by a scaled version of the legacy interleaver (610), and then parsed by a round-robin parser (620).

16 Claims, 4 Drawing Sheets

U.S. PATENT DOCUMENTS

| | | |
|---|---|---|
| 8,254,480 B2 * | 8/2012 | Aytur et al. .................. 375/260 |
| 2004/0258025 A1 | 12/2004 | Li |
| 2005/0152327 A1 * | 7/2005 | Erlich et al. ................. 370/343 |
| 2006/0002486 A1 * | 1/2006 | van Nee ........................ 375/260 |
| 2006/0036924 A1 * | 2/2006 | Ghosh ........................... 714/755 |
| 2006/0104377 A1 * | 5/2006 | Chimitt et al. ................ 375/261 |
| 2006/0227892 A1 | 10/2006 | Ouyang |
| 2008/0212652 A1 * | 9/2008 | Parker et al. .................. 375/133 |

* cited by examiner

METHOD AND SYSTEM OF INTERLEAVING FOR A MULTIPLE-INPUT MULTIPLE-OUTPUT MULTI-BAND OFDM COMMUNICATION SYSTEM

This invention pertains to the field of wireless communication networks, and more particularly to a method and system of interleaving data for a multiple-input multiple-output multi-band OFDM communication system.

Data interleaving is commonly used in digital communication systems in order to destroy the memory effects of "multipath" fading (e.g., Rayleigh fading) channels and improve the performance of convolutionally coded data streams when decoded with Viterbi decoders. In such communication systems, the transmitter interleaves sequential bits of encoded data such that they are no longer transmitted sequentially, where the adjacent bits are separated by certain distance. At the receiver, a deinterleaver is required to recover the coded data in the reverse order before applying it to a convolutional decoder (e.g., a Viterbi decoder).

Figure 1:
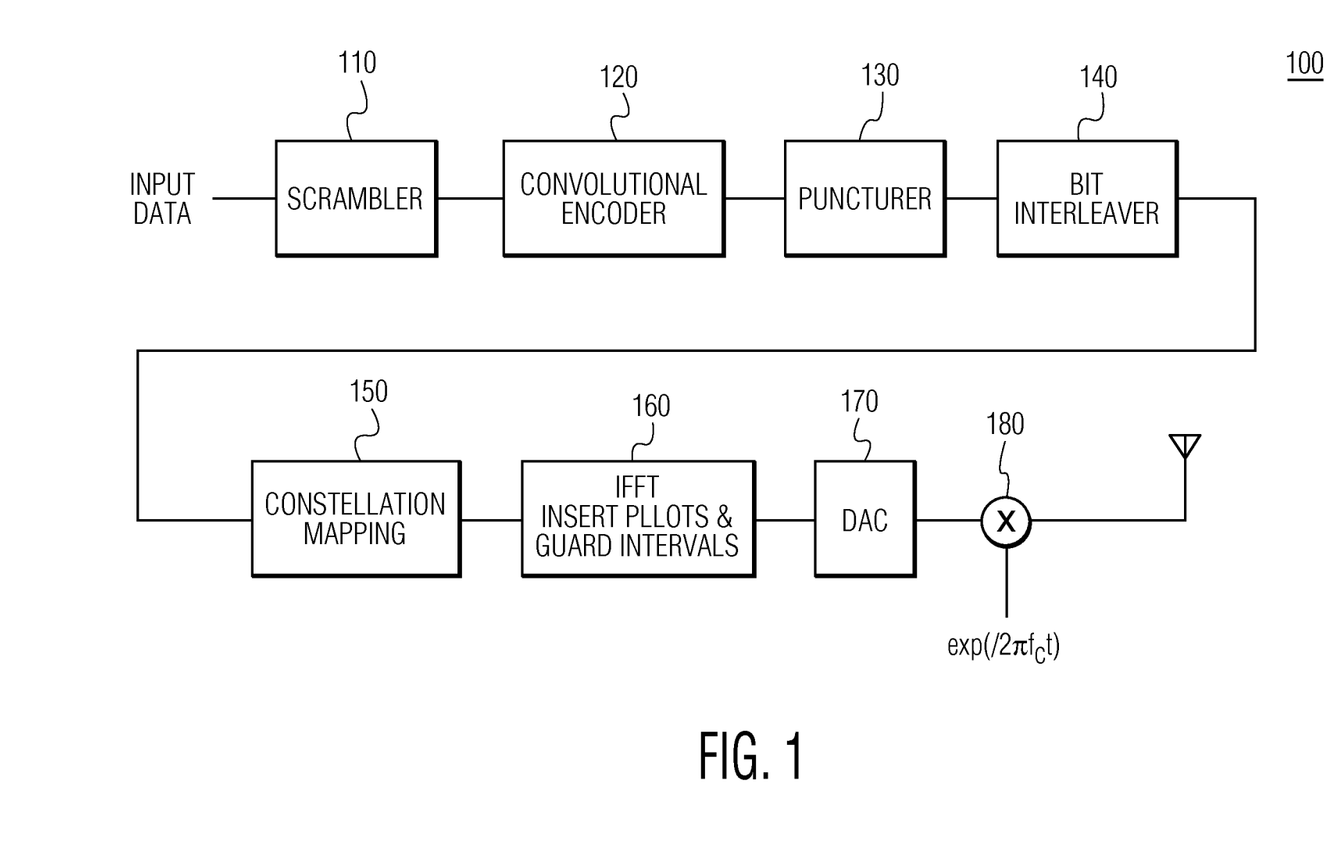
FIG. 1 is a functional block diagram of an ultra-wideband (UWB) multi-band (MB) orthogonal frequency division multiplex (OFDM) transmission system.

A digital communication network according to the WIMEDIA® Alliance specifications is an example of such a system that employs interleaving for improved performance. The WIMEDIA® specifications describe a multi-band (MB) orthogonal frequency division multiplex (OFDM) transmission format for ultra-wideband (UWB) communications. FIG. 1 shows a functional block diagram of one embodiment of a UWB MB-OFDM transmitter 100. The transmitter 100 pertains to a single-input, single-output (SISO) transmission system. As can be seen in FIG. 1, the transmission chain includes scrambler 110, convolutional encoder 120, puncturer 130, interleaver 140, constellation mapper 150, inverse Fourier transformer 160, digital-to-analog converter 170, and modulator 180.

Figure 2:
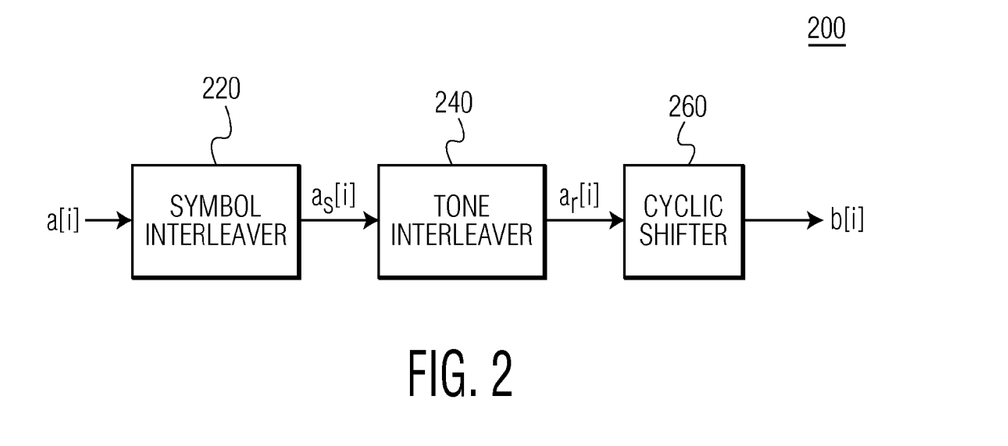
FIG. 2. is a functional block diagram of a three-stage interleaver.

The physical layer of the WIMEDIA® physical layer specification version 1.1 ("WIMEDIA® PHY 1.1") describes a three-stage interleaver 140. FIG. 2 is a functional block diagram of a three-stage interleaver 200 according to the WIMEDIA® specification. Three-stage interleaver 200 includes a symbol interleaver 220, a tone interleaver 240, and a cyclic shifter 260.

Symbol interleaver 220 receives and interleaves encoded data over k=6 symbols, where each symbol includes x=200 coded bits. The symbol interleaving operation is performed by first grouping the coded bits into blocks of k*x bits (corresponding to k "on-air" OFDM symbols of x bits each) and then using a block interleaver of size x by k to permute the coded bits. Let the sequences a[i] and $a_S[i]$, where i=0, 1, ..., (k*x−1), represent the input and output bits of the symbol block interleaver, respectively. The output of the symbol block interleaver is given by the following relationship:

$$a_S[i] = a\left[\left(\frac{i}{x}\right) + k*\mathrm{mod}(i, x)\right] \qquad 1)$$

The output of symbol interleaver 220, which is grouped together into blocks of x bits, is then permuted by tone interleaver 240, which is a regular block intra-symbol interleaver of size y by j, where y*j=x. For example, when x=200, then y may be 20, and j may be 10. Let the sequences $a_S[l]$ and $a_T[l]$, where l=0, ..., (x−1), represent the input and output bits of tone interleaver 240, respectively. The output of tone interleaver 240 is given by the following relationship:

$$a_T[l] = a\left[\left(\frac{l}{y}\right) + j*\mathrm{mod}(l, y)\right] \qquad 2)$$

The output of tone interleaver 240 is then passed through intra-symbol cyclic shifter 260, which provides a different cyclic shift for each block of x bits within the span of symbol interleaver 220. Let the sequences $a_T[i]$ and b[i], where i=0, ..., (k*x−1), represent the input and output bits of cyclic shifter 260, respectively. The output of cyclic shifter 260 is given by the following relationship:

$$b[i] = a_T[r(i) + x + \mathrm{mod}(i + r(i)*m, x)], \qquad 3)$$

where r(i)=floor(i/x), where i=0, ..., (x−1), and m is the cycle shift of cyclic shifter 260.

Meanwhile, the WIMEDIA® specifications are being expanded to support multiple-input, multiple-output (MIMO) transmissions. In a MIMO UWB multi-band OFDM communication system, more than one spatial stream is transmitted via more than one transmitting antenna. In general, if the number of transmitter antennas is N, then N spatial streams are generated.

A new MIMO communication system should be backward compatible with previous WIMEDIA® specifications. In particular, the data interleaving approach for any new MIMO multi-band OFDM communication system should be compatible with previous WIMEDIA® specifications, in particular WIMEDIA® PHY 1.1.

In one aspect of the invention, a method is provided for transmitting data with N transmission signals via a multiple-input multiple-output multi-band OFDM transmitter operable to communicate with a receiver adapted to receive data interleaved with a legacy interleaver. The method comprises: parsing data into N parsed data streams with a round-robin parser; interleaving a first one of the N parsed data streams with a first legacy interleaver to produce an interleaved data stream; and for i=(1, N−1) producing an $i^{th}$ interleaved data stream by: shifting an $i^{th}$ one of the N parsed data streams through a bit shifter that shifts the parsed data stream by i*x bits where x is the number of bits in a transmitted symbol, and interleaving the shifted $i^{th}$ parsed data stream with an $i^{th}$ legacy interleaver to produce the $i^{th}$ interleaved data stream.

In another aspect of the invention, a multiple-input multiple-output multi-band OFDM transmitter is provided operable to communicate with a receiver adapted to receive data interleaved with a legacy interleaver. The transmitter comprises: a round-robin parser adapted to parse data into N parsed data streams; a first legacy interleaver adapted to receive a first one of the N parsed data streams and to produce therefrom an interleaved data stream; N−1 bit shifters each adapted to receive of the N parsed data streams and to shift the parsed data stream by i*x bits, where i is an integer and x is the number of bits in a transmitted symbol; and N−1 shifters legacy interleavers each adapted to receive one of the shifted parsed data streams and to produce therefrom an interleaved data stream.

In still another aspect of the invention, a method is provided for transmitting data with N transmission signals via a multiple-input multiple-output multi-band OFDM transmitter operable to communicate with a receiver adapted to receive data interleaved with a legacy interleaver over k symbols each comprising x bits per symbol. The method comprises: receiving a set of N*k*x bits; splitting the set of N*k*x bits into N subsets of bits, each subset being comprised of k*x sequential bits from the original set of N*k*x bits; and interleaving each of the N subsets of bits.

In yet another aspect of the invention, a multiple-input multiple-output multi-band OFDM transmitter is provided operable to communicate with a receiver adapted to receive data interleaved with a legacy interleaver over k symbols each comprising x bits per symbol, the method comprising: a data splitter adapted to split a set of N*k*x bits into N subsets of bits, each group being comprised of a subset of k*x sequential bits from the original set of N*k*x bits; and N legacy interleavers each adapted to interleave a corresponding of the N subsets of bits.

In a further aspect of the invention, a method is provided for transmitting data with N transmission signals via a multiple-input multiple-output multi-band OFDM transmitter operable to communicate with a receiver adapted to receive data interleaved with a legacy interleaver. The legacy interleaver includes a symbol interleaver interleaving k symbols with x bits per symbol, a tone interleaver interleaving groups of x bits from the symbol interleaver using blocks of y by j bits, and a cyclic shifter cyclically shifting data from the tone interleaver with a cycle shift of m. The method comprises: symbol interleaving k symbols of data with Nx bits per symbol; tone interleaving groups of Nx symbol-interleaved bits using blocks of Ny by j bits; cyclically shifting the tone-interleaved bits with a cycle shift of m; and parsing the cyclically shifted data into N transmission data streams with a round-robin parser.

In a still further aspect of the invention, a multiple-input multiple-output transmitter is provided operable to communicate with a receiver adapted to receive data interleaved with a legacy interleaver. The legacy interleaver includes a symbol interleaver interleaving k symbols by x bits per symbol, a tone interleaver which interleaves groups of x bits from the symbol interleaver using blocks of y by j bits, and a cyclic shifter having a cycle shift of m. The transmitter comprises: a scaled legacy interleaver, comprising, a symbol interleaver adapted to interleave k symbols with Nx bits per symbol, a tone interleaver adapted to interleave groups of Nx bits from the symbol interleaver using blocks of Ny by j bits, and a cyclic shifter adapted to shift the tone-interleaved data with a cycle shift of m; and a round-robin parser adapted to parse the cyclically interleaved data into N transmission data streams.

While various principles and features of the methods and systems described below can be applied to a variety of communication systems, for illustration purposes the exemplary embodiments below will be described in the context of a MIMO UWB multi-band OFDM communication system. However, the broad principles described below could also be applied in the case of other communication systems operating with different communication protocols. Of course, the scope of the invention is defined by the claims appended hereto, and is not limited by the particular embodiments described below.

With this in mind, we now describe methods and systems for interleaving data for a MIMO multi-band OFDM communication system.

Beneficially a MIMO multi-band OFDM communication system should be backward compatible with previous specifications. In that case, reusing the interleaver 200 described above (hereafter referred to as "legacy interleaver 200") can be a good approach. Suppose that the number of transmitter antennas for the MIMO transmitter is N. In that case, N data streams are required. The simplest way to interleave the data is to parse the bits into N data streams and employ an interleaver 200 on each data stream. However, such an approach suffers from certain drawbacks. For example, with this approach the adjacent bits (even and odd) will be mapped to the same sub-band as well as the same sub-carrier in each antenna. Frequency diversity, including sub-band frequency diversity and sub-carrier frequency diversity, cannot be explored by this method.

Figure 3:
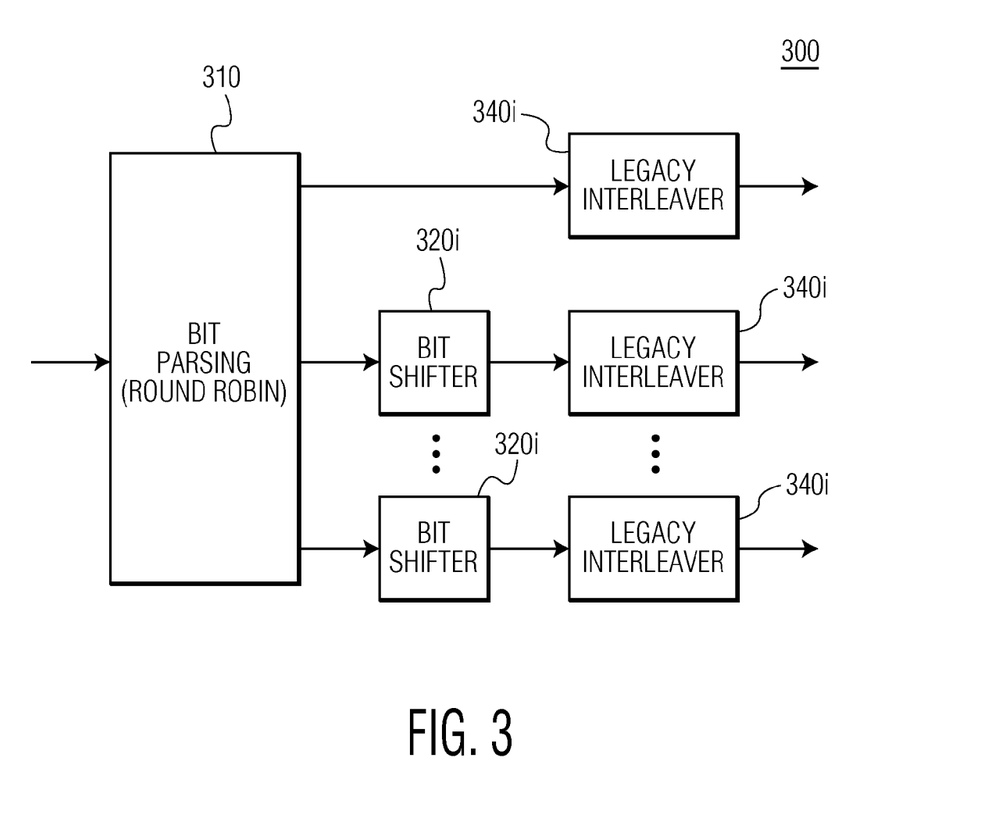
FIG. 3 is a functional block diagram illustrating a first embodiment of an interleaving arrangement for a multiple-input, multiple-output (MIMO) MB-OFDM transmission system, incorporating the architecture of a legacy interleaver.

Accordingly, FIG. 3 is a functional block diagram illustrating a first embodiment of an interleaving arrangement 300 for a MIMO transmission system, incorporating the architecture of legacy interleaver 200. As will be appreciated by those skilled in the art, one or more of the various "parts" shown in FIG. 3 may be physically implemented using a software-controlled microprocessor, hard-wired logic circuits, or a combination thereof. Also, while the parts are functionally segregated in FIG. 3 for explanation purposes, they may be combined variously in any physical implementation.

Interleaving arrangement 300 includes round-robin bit parser 310, (N−1) bit shifters 320$i$, and N legacy interleavers 340$i$. Interleaving arrangement 300 produces N data streams for a MIMO multi-band OFDM transmitter employing N transmission signals. Beneficially, each legacy interleaver 340$i$ corresponds to interleaver 200 as described above with respect to FIG. 2.

Operationally, round-robin bit parser 310 receives a bit stream (e.g., a convolutionally-encoded bit stream) and parses the bit stream into N separate data streams on a round-robin basis. That is, for a first group of N bits, round-robin bit parser 310 distributes a first bit to a first data stream, a second bit to a second data stream, an $i^{th}$ bit to an $i^{th}$ data stream, etc., until all N bits are distributed to the N data streams. Then for a next group of N bits, round-robin bit parser 310 repeats the process, thereby producing N data streams each having a data rate that is 1/N times the data rate of the originally-received bit stream.

For an $i^{th}$ data stream output by round-robin bit parser 310, for i=(0, N−1), a corresponding bit shifter 320$i$ is provided that shifts the incoming bits by i*x bits, where x is equal to the number of bits in a symbol (e.g., x=200). That is, each bit shifter 320$i$ shifts the received data stream by an integer number of symbols. Of course in the case where i=0, then no bit shifter 320 is needed. That is, the first data stream does not require a bit shifter, but there are N−1 bit shifters for the remaining N−1 data streams.

The output from each bit shifter 320$i$ is then applied to a corresponding one of the N legacy interleavers 340$i$. Each legacy interleaver 340i operates as described above with respect to interleaver 200: symbol interleaving k symbols of data with x bits per symbol; tone interleaving groups of x symbol-interleaved bits using blocks of y by j bits; and cyclically shifting the tone-interleaved bits with a cycle shift of m. Beneficially, in one embodiment, for compatibility with a legacy interleaver according to the WIMEDIA® specifications, k=6, x=200, y=20, j=10, and m=33.

For a MIMO UWB MB-OFDM system, according to the arrangement of FIG. 3 the bits in every OFDM symbol of the N data streams will be mapped to the frequency sub-bands in a different order. For example, in one case where N=2, then every OFDM symbol of the first data stream will be mapped to the order of sub-band 1,2,3,1,2,3 and the bits in every OFDM symbol of the second data stream will be mapped to the order of sub-band 2,3,1,2,3,1. Since the two data streams will be mapped to different frequency sub-bands, frequency diversity will be better explored from different channel impulse responses in different sub-bands. Accordingly, correlation between sub-bands and antennas after interleaving can be automatically substantially reduced.

Figure 4:
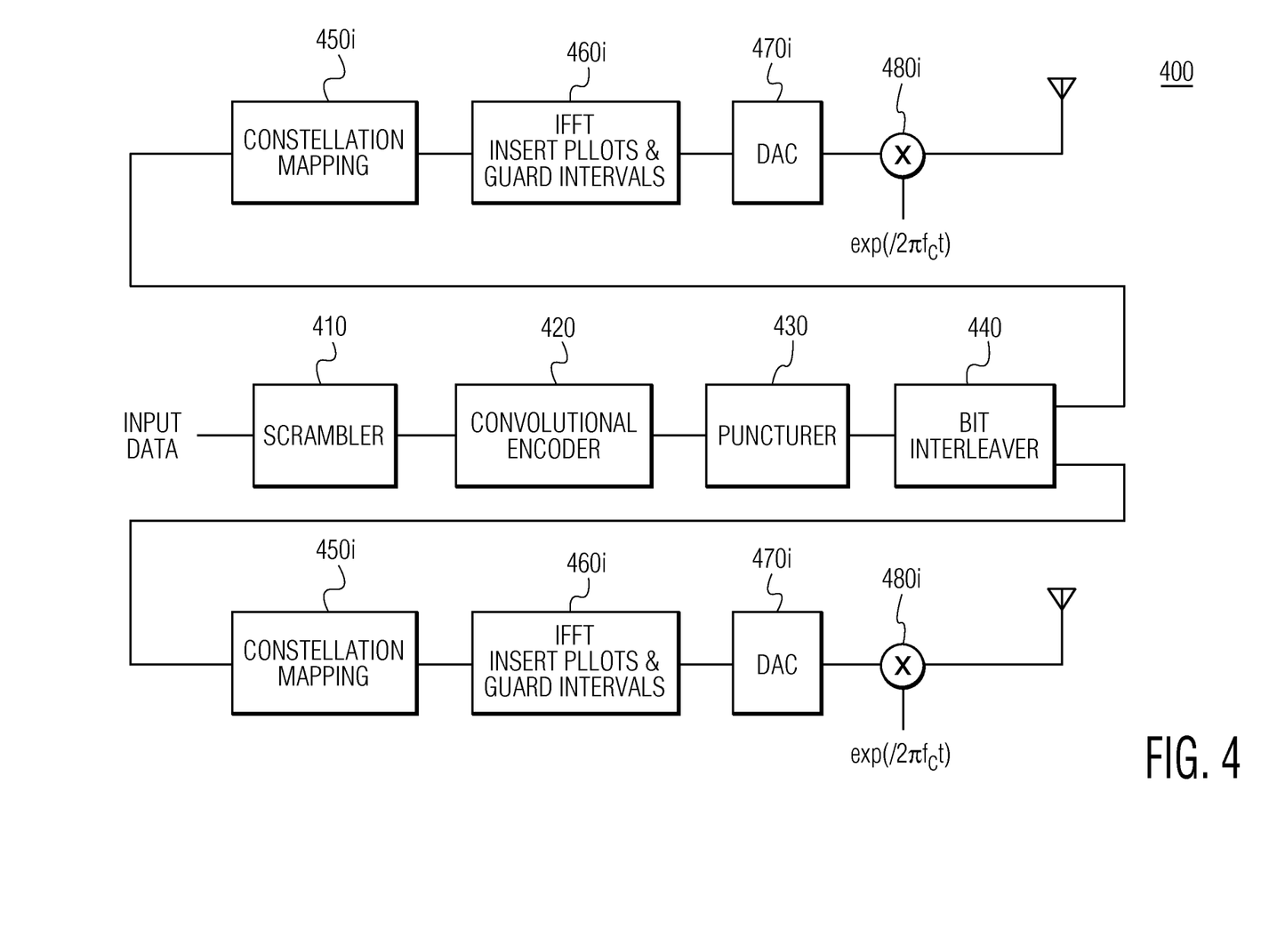
FIG. 4 is a functional block diagram of a MIMO MB-OFDM transmission system.

FIG. 4 illustrates one embodiment of a MIMO UWB MB-OFDM transmission system 400 that may employ interleaving arrangement 300. As will be appreciated by those skilled in the art, one or more of the various "parts" shown in FIG. 4 may be physically implemented using a software-controlled microprocessor, hard-wired logic circuits, or a combination thereof. Also, while the parts are functionally segregated in FIG. 4 for explanation purposes, they may be combined variously in any physical implementation.

As can be seen in FIG. 4, the transmission chain includes scrambler 410, convolutional encoder 420, puncturer 430, interleaver 440, N constellation mappers 450i, N inverse Fourier transformers 460i, N digital-to-analog converters 470i, and N modulators 480i. In one embodiment, interleaver 440 corresponds to interleaver arrangement 300 of FIG. 3. Beneficially, MIMO multi-band OFDM transmitter 400 is operable to communicate with a receiver adapted to receive data interleaved with a legacy interleaver.

Figure 5:
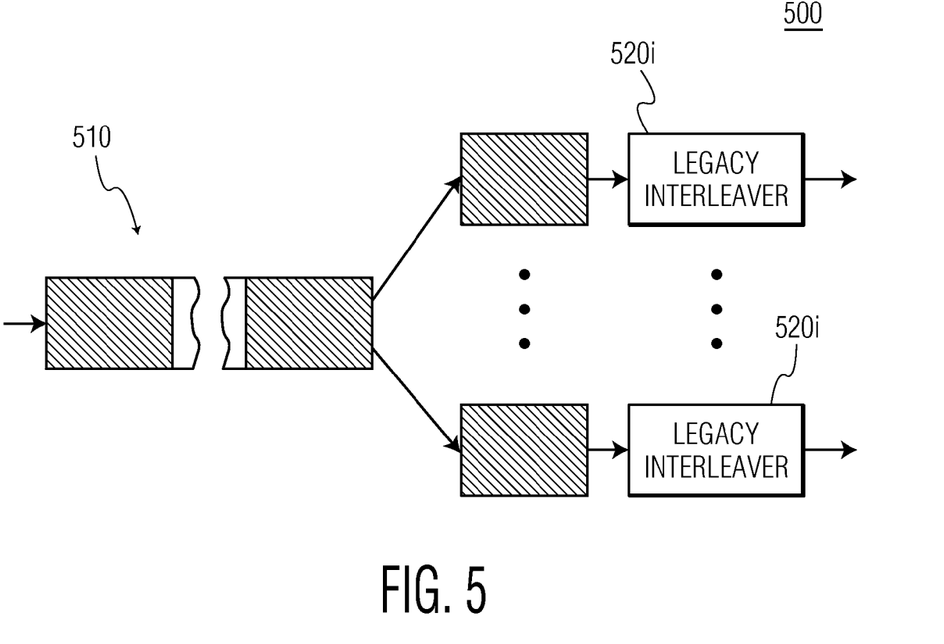
FIG. 5 is a functional block diagram illustrating a second embodiment of an interleaving arrangement for a MIMO MB-OFDM transmission system, incorporating the architecture of a legacy interleaver.

FIG. 5 is a functional block diagram illustrating a second embodiment of an interleaving arrangement 500 for a MIMO multi-band OFDM transmission system, incorporating the architecture of legacy interleaver 200. As will be appreciated by those skilled in the art, one or more of the various "parts" shown in FIG. 5 may be physically implemented using a software-controlled microprocessor, hard-wired logic circuits, or a combination thereof. Also, while the parts are functionally segregated in FIG. 5 for explanation purposes, they may be combined variously in any physical implementation.

Interleaving arrangement 500 includes data splitter 510, and N legacy interleavers 520i. Interleaving arrangement 500 produces N data streams for a MIMO multi-band OFDM transmitter employing N transmission signals.

Operationally, data splitter 510 receives a bit stream (e.g., a convolutionally encoded bit stream) and divides the bit stream into N separate data streams each comprising groups of consecutive or sequential bits from the original bit stream. That is, data splitter 510 receives sets of N*k*x bits where: N is the number of antennas being employed (and therefore the number of data streams to be produced); k is the number of symbols to be interleaved by a symbol interleaver of legacy interleaver 520i; and x is the number of bits in a symbol. Data splitter 510 splits each set of N*k*x bits into N subsets of bits, each subset being comprised of k*x sequential or consecutive bits from the original set of N*k*x bits.

Each legacy interleaver 520i interleaves a corresponding one of the N subsets of bits to produce N interleaved data streams. Each legacy interleaver 520i operates as described above with respect to interleaver 200: symbol interleaving k symbols of data with x bits per symbol; tone interleaving groups of x symbol-interleaved bits using blocks of y by j bits; and cyclically shifting the tone-interleaved bits with a cycle shift of m. Beneficially, in one embodiment, for compatibility with a legacy interleaver according to the WIMEDIA® specifications, k=6, x=200, y=20, j=10, and m=33.

The MIMO UWB MB-OFDM transmission system 400 of FIG. 4 may employ interleaving arrangement 500 for interleaver 440.

Figure 6:
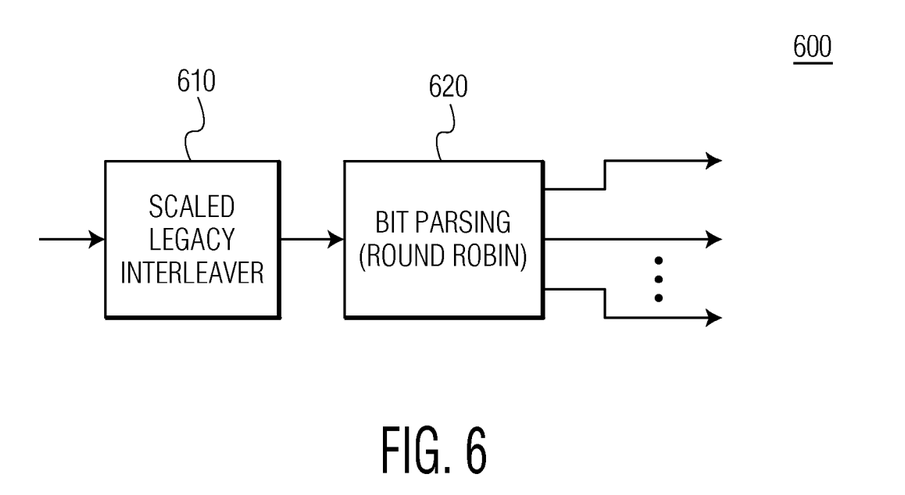
FIG. 6 is a functional block diagram illustrating a third embodiment of an interleaving arrangement for a MIMO MB-OFDM transmission system, incorporating the architecture of a legacy interleaver.

FIG. 6 is a functional block diagram illustrating a third embodiment of an interleaving arrangement 600 for a MIMO multi-band OFDM transmission system, incorporating the architecture of legacy interleaver 200. As will be appreciated by those skilled in the art, one or more of the various "parts" shown in FIG. 6 may be physically implemented using a software-controlled microprocessor, hard-wired logic circuits, or a combination thereof. Also, while the parts are functionally segregated in FIG. 6 for explanation purposes, they may be combined variously in any physical implementation.

Interleaving arrangement 600 includes a scaled legacy interleaver 610 and round-robin bit parser 620. Scaled interleaver 610 has a same architecture as legacy interleaver 200 of FIG. 2, but some of the parameters are scaled to accommodate the multiple data streams of a MIMO transmission system. The scaling factor depends on the number, N, of transmit antennas employed in the MIMO multi-band OFDM transmitter, and the modulation size relative to its maximum data rate mode. For example, as before, let k be the number of symbols interleaved by symbol interleaver 220 of legacy interleaver 200, let x be the number of bits in each symbol, let symbol interleaver 240 operate with block size y by j, where y*j=x, and let cyclic shifter 260 of legacy interleaver 200 operate with a cycle shift of m. In that case, in scaled legacy interleaver 610 the symbol interleaver interleaves k symbols of data with Nx bits per symbol; the tone interleaver interleaves groups of Nx bits from the symbol interleaver using blocks of Ny by j bits; and the cyclical shifter cyclically shifts the tone interleaved bits with a cycle shift of m. Beneficially, in one embodiment, for compatibility with a legacy interleaver according to the WIMEDIA® specifications, k=6, x=200, y=20, j=10, and m=33. In that case, in scaled legacy interleaver 610, the symbol interleaver interleaves 6 symbols of data with 400 bits per symbol, the tone interleaver interleaves groups of 400 bits from the symbol interleaver using blocks of 40 by 10 bits, and the cyclical shifter cyclically shifts the tone interleaved bits with a cycle shift of 33.

Operationally, scaled legacy interleaver 610 receives an input bit stream and interleaves it as described above. Then round-robin bit parser 620 performs a bit-by-bit round-robin parsing on the interleaved data to produce N interleaved data streams, as described above with respect to interleaving arrangement 300.

The advantage of this approach is that after the three-stage interleaver, every pair of adjacent bits will be coming from different sub-bands as well as different sub-carriers. Every pair of adjacent bits before interleaving will be mapped into k sub-bands with good separation. Parsing interleaved bits into different antennas will still keep the same interleaving effect as before.

The MIMO MB-OFDM transmission system 400 of FIG. 4 may employ interleaving arrangement 600 for interleaver 440.

While preferred embodiments are disclosed herein, many variations are possible which remain within the concept and scope of the invention. Such variations would become clear to one of ordinary skill in the art after inspection of the specification, drawings and claims herein. The invention therefore is not to be restricted except within the spirit and scope of the appended claims.

The invention claimed is:

1. A method of transmitting data with N transmission signals via a multiple-input multiple-output multi-band OFDM transmitter operable to communicate with a receiver adapted to receive data interleaved with a legacy interleaver, the method comprising:
   parsing data into N parsed data streams;
   interleaving a first one of the N parsed data streams to produce an interleaved data stream;
   for i=(1, N−1) producing an $i^{th}$ interleaved data stream by:
      shifting an $i^{th}$ one of the N parsed data streams by i*x bits where x is the number of bits in a transmitted symbol, and
      interleaving the shifted $i^{th}$ parsed data stream to produce the $i^{th}$ interleaved data stream; and
   transmitting each of the N interleaved data streams over sub-bands in a different sub-band order, wherein the transmitting includes hopping over a plurality of sub-bands.

2. The method according to claim 1, wherein interleaving the shifted $i^{th}$ parsed data stream comprises:
   symbol interleaving k symbols of data with x bits per symbol;
      tone interleaving groups of x symbol-interleaved bits using blocks of y by j bits; and
      cyclically shifting the tone-interleaved bits with a cycle shift of m.

3. The method according to claim 2, where k=6, x=200, y=20, j=10, and m=33.

4. A multiple-input multiple-output multi-band OFDM transmitter operable to communicate with a receiver adapted to receive data interleaved with a legacy interleaver, the transmitter comprising:
   a round-robin parser adapted to parse data into N parsed data streams;
   a first legacy interleaver adapted to receive a one of the N parsed data streams and produce an interleaved data stream;
   N−1 bit shifters, each adapted to receive the one of the N parsed data streams and to shift the parsed data stream by i*x bits, where i is an integer and x is the number of bits in a transmitted symbol; and
   N−1 shifters legacy interleavers each adapted to receive one of the shifted parsed data streams and to produce therefrom an interleaved data stream;
   wherein the transmitter hops over a plurality of sub-bands, and wherein each of the N interleaved data streams are transmitted over sub-bands in a different sub-band order.

5. The transmitter according to claim 4, wherein each legacy interleaver further comprises:
   a symbol interleaver adapted to interleave k symbols with x bits per symbol,
   a tone interleaver adapted to interleave groups of x bits from the symbol interleaver using blocks of y by j bits, and
   a cyclic shifter adapted to cyclically shift the tone-interleaved data with a cycle shift of m.

6. The transmitter according to claim 5, where k=6, x=200, y=20, j=10, and m=33.

7. A method of transmitting data with N transmission signals via a multiple-input multiple-output multi-band OFDM transmitter operable to communicate with a receiver adapted to receive data interleaved with a legacy interleaver over k symbols each comprising x bits per symbol, the method comprising:
   receiving a set of N*k*x bits;
   splitting the set of N*k*x bits into N subsets of bits, each subset being comprised of k*x sequential bits from the original set of N*k*x bits;
   interleaving each of the N subsets of bits to produce N interleaved data streams; and
   transmitting each of the N interleaved data streams over sub-bands in a different sub-band order, wherein the transmitting includes hopping over a plurality of sub-bands.

8. The method according to claim 7, wherein interleaving each of the N subsets of bits further comprises:
   symbol interleaving k symbols of data with x bits per symbol;
   tone interleaving groups of x symbol-interleaved bits using blocks of y by j bits; and
   cyclically shifting the tone-interleaved bits with a cycle shift of m.

9. The method according to claim 8, where k=6, x=200, y=20, j=10, and m=33.

10. A multiple-input multiple-output multi-band OFDM transmitter operable to communicate with a receiver adapted to receive data interleaved with a legacy interleaver over k symbols each comprising x bits per symbol, the transmitter comprising:
   a data splitter adapted to split a set of N*k*x bits into N subsets of bits, each group being comprised of a subset of k*x sequential bits from the original set of N*k*x bits; and
   N legacy interleavers each adapted to interleave a corresponding one of the N subsets of bits;
   wherein the transmitter hops over a plurality of sub-bands, and wherein each of the N interleaved data streams are transmitted over sub-bands in a different sub-band order.

11. The transmitter according to claim 10, wherein each legacy interleaver comprises:
   a symbol interleaver adapted to interleave k symbols with x bits per symbol,
   a tone interleaver adapted to interleave groups of x bits from the symbol interleaver using blocks of y by j bits, and
   a cyclic shifter adapted to cyclically shift the tone-interleaved data with a cycle shift of m.

12. The transmitter according to claim 11, where k=6, x=200, y=20, j=10, and m=33.

13. A method of transmitting data with N transmission signals via a multiple-input multiple-output multi-band OFDM transmitter operable to communicate with a receiver adapted to receive data interleaved with a legacy interleaver including a symbol interleaver interleaving k symbols with x bits per symbol, a tone interleaver interleaving groups of x bits from the symbol interleaver using blocks of y by j bits, and a cyclic shifter cyclically shifting data from the tone interleaver with a cycle shift of m, the method comprising:

symbol interleaving k symbols of data with 2x bits per symbol;
tone interleaving groups of 2x symbol-interleaved bits using blocks of 2y by j bits;
cyclically shifting the tone-interleaved bits with a cycle shift of m;
parsing the cyclically shifted data into N transmission data streams with a round-robin parser; and
transmitting each of the N interleaved data streams over sub-bands in a different sub-band order, wherein the transmitting includes hopping over a plurality of sub-bands.

14. The method according to claim 13, where k=6, x=200, y=20, j=10, and m=33.

15. A multiple-input multiple-output multi-band OFDM transmitter operable to communicate with a receiver adapted to receive data interleaved with a legacy interleaver having a symbol interleaver interleaving k symbols by x bits per symbol, a tone interleaver which interleaves groups of x bits from the symbol interleaver using blocks of y by j bits, and a cyclic shifter having a cycle shift of m, the transmitter comprising:
 a scaled legacy interleaver, comprising,
  a symbol interleaver adapted to interleave k symbols with Nx bits per symbol,
  a tone interleaver adapted to interleave groups of Nx bits from the symbol interleaver using blocks of Ny by j bits, and
  a cyclic shifter adapted to cyclically shift the tone-interleaved data with a cycle shift of m; and
 a round-robin parser adapted to parse the cyclically shifted data into N transmission data streams;
wherein the transmitter hops over a plurality of sub-bands, and wherein each of the N interleaved data streams are transmitted over sub-bands in a different sub-band order.

16. The transmitter according to claim 15, where k=6, x=200, y=20, j=10, and m=33.

* * * * *